United States Patent [19]

Class et al.

[11] Patent Number: 4,472,259
[45] Date of Patent: Sep. 18, 1984

[54] FOCUSING MAGNETRON SPUTTERING APPARATUS

[75] Inventors: Walter H. Class, Yonkers; Arnold J. Aronson, Pomona, both of N.Y.; Steven D. Hurwitt, Park Ridge, N.J.; Michael L. Hill, New York, N.Y.

[73] Assignee: Materials Research Corporation, Orangeburg, N.Y.

[21] Appl. No.: 316,433

[22] Filed: Oct. 29, 1981

[51] Int. Cl.³ .............................................. C23C 15/00
[52] U.S. Cl. .................................. 204/298; 204/192 R
[58] Field of Search ............................ 204/192 R, 298

[56] References Cited

U.S. PATENT DOCUMENTS

| | | | |
|---|---|---|---|
| 2,146,025 | 2/1939 | Penning | 250/27.5 |
| 3,562,142 | 2/1971 | Lamont, Jr. | 204/298 |
| 3,878,085 | 4/1975 | Corbani | 204/298 |
| 4,041,353 | 8/1977 | Penfold et al. | 315/267 |
| 4,060,470 | 11/1977 | Clarke | 204/192 R |
| 4,198,283 | 4/1980 | Class et al. | 204/298 |

FOREIGN PATENT DOCUMENTS 2058143 4/1981 United Kingdom ............... 204/298

OTHER PUBLICATIONS

John L. Vossen et al., Thin Film Processes, Academic Press, New York, 1978, pp. 115–117, 126–128.

Primary Examiner—G. L. Kaplan
Assistant Examiner—William T. Leader
Attorney, Agent, or Firm—Kenyon & Kenyon

[57] ABSTRACT

A cathode assembly for use in a magnetron sputtering system, the system having a cathode assembly with parallel elongated target segments which are formed substantially of a material which is desired to be sputter-deposited onto a substrate. The elongated target segments are each provided with a material removal surface which is inclined toward the other segment with respect to the plane of the substrate. Such inclination permits the material which is removed from the target bars to be focused onto a relatively narrow area, thereby improving the efficiency of the sputtering operation and reducing machine down-time for cleaning and vacuum pumping. In other embodiments, end target segments are provided for improving the efficiency of film deposition near the ends of the elongated bars. The end target segments are provided with material removal surfaces which are also inclined, and connect with the elongated target segments to form a rectangular frame arrangement.

8 Claims, 4 Drawing Figures

FOCUSING MAGNETRON SPUTTERING APPARATUS

BACKGROUND OF THE INVENTION

This invention relates generally to sputtering systems, and more particularly, to magnetically enhanced sputtering apparatus having an elongated target arrangement.

The application of magnetic field enhancement to an elongated cathode configuration in a gas discharge sputtering device is described in U.S. Pat. No. 3,878,085, which issued to J. F. Corbani on Apr. 15, 1975. Corbani confirms the discovery reported in U.S. Pat. No. 2,146,025 of Penning that the power consumption of a sputtering system can be greatly reduced, and the quality and deposition rate of the coating on a substrate improved, by magnetically retaining the electrons of the gas discharge in a region near the cathode of the sputtering system. In the Corbani apparatus, retention is achieved by providing a tunnel-like magnetic field adjacent to the target surface in which the charged particles move.

When the tunnel-like magnetic field is made to close on itself to form a closed loop adjacent to the sputtering target surface, the sputtering process becomes very efficient because the electrons can no longer escape from the ends of the tunnel. Sputtering methods using the closed loop approach have been given the name "magnetron sputtering," and the surface of the cathode enclosed by the magnetic tunnel is called the "race-track."

Sputtered material emanates from a magnetron sputtering cathode predominantly from the race-track region. The distribution of this material is usually very nonuniform. Uniform film coating on a substrate is therefore accomplished by some means of moving the substrate, which has the effect of averaging and thereby smoothing the sputtered deposit. Thus, the practical applications of magnetron sputtering have resulted from the combination of a particular magnetic tunnel and target configuration (which defines the race-track) with an appropriate substrate motion to achieve a system providing acceptable coating uniformity. Magnetically enhanced sputtering has been the subject of extensive patent activity. (U.S. Pat. Nos. 2,146,025, 3,282,816, 3,884,793, 3,995,187, 4,030,996, 4,031,424, 4,041,353, 3,711,398, 4,060,470, 4,111,782, 4,116,793, 4,194,962, 4,166,018 and 4,198,283).

This invention relates to that type of system which combines a sputtering cathode, having an elongated closed loop magnetic tunnel which encloses a correspondingly-shaped sputtering surface (race track), with a linear translation of the substrate past the sputtering surface.

The preferred practice regarding the use of such a cathode involves scanning the substrates past the cathode, usually in a plane parallel to the plane defined by the race-track and separated therefrom by a distance referred to as the target-to-substrate distance. Such motion is further usually directed perpendicular to the long axis of the race-track. By convention, that substrate dimension which lies in the plane of motion and extends transverse to the scanning direction is referred to as the substrate width, and that which extends parallel to the scanning direction is referred to as the substrate length.

There are two types of sputtered material loss which occur when using the above configuration. The first arises because coating uniformity requires that the long axis of the race-track exceed the width of the substrate. For example, to assure a coating thickness nonuniformity of no more than ±10% across the substrate width typically requires that the race-track length be 3" to 4" longer than this width; i.e., coating a 12" wide substrate requires a 15" to 16" long race-track region. Thus, sputtered material accumulates on apparatus components which lie opposite the target and adjacent to the width dimensions of the substrate. This constitutes a loss of sputtered material which is here referred to as target end loss.

The second type of material loss arises when a substrate of finite length is to be coated. Here, a common practice consists of positioning the substrate leading edge immediately adjacent to the deposition zone of the sputtering target. Sputtering is then commenced and scanning motion of the substrate initiated. This process is maintained until the trailing edge of the substrate clears the deposition zone. If the deposition zone of the cathode has a length l, measured in the scan direction, and the substrate has a length L, then the total distance traversed by the substrate is the distance l+L. However, during part of this process, the substrate does not cover the deposition zone, so sputtered material deposits onto parts of the sputtering machine in front of or behind the substrate. The fraction of material thus lost is given by the ration $l/(l+L)$. This loss (called an overscan loss) can be minimized by reducing l, the length of the film deposition zone produced by the cathode.

Both overscan losses and target end losses cause sputtered material accumulation on apparatus components. This requires frequent process interruption for removing the unwanted material and subsequent cleaning of the apparatus components.

The principal object of this invention is to provide a cathode which focuses the sputtered material emanating from an elongated race-track region to reduce the length of the deposition zone, thereby reducing overscan losses, and also to reduce the width of the deposition zone, thereby minimizing target end losses. In addition, since focusing decreases the area over which deposition occurs, the deposition rate in the smaller resulting deposition zone of the target is correspondingly increased.

It is known that the incorporation of residual gas contaminants in the coating is controlled by the mathematical relationship R/P, where R is the film deposition rate, and P is the residual gas pressure. Thus, an increase in deposition rate R which results from the above focusing permits an increase in the allowable residual gas pressure P without exceeding acceptable limits of coating impurity The increase in allowable residual gas pressure P permits the use of lower quality vacuum pumping equipment and shorter pump-down times prior to starting deposition, and it generally makes the coating process more tolerant to small air leaks in the sputtering system. This advantage is especially important in the deposition of aluminum and its alloys in the manufacture of semiconductor integrated circuits, which deposition is adversely affected by sputtering system residual gas contamination.

A further advantage of such focusing is that it reduces waste of sputtering material, by reducing the amount of material deposited onto the structural components of the sputtering machine, and reduces system down-time for cleaning and vacuum pump-down time prior to operation of the system.

SUMMARY OF THE INVENTION

The foregoing and other objects are achieved by providing a cathode assembly for a magnetron sputtering apparatus having at least first and second elongated target segments which are formed of a material which is to be sputter-deposited onto a substrate as the latter is moved past the target on a pallet. The elongated target segments are arranged in the cathode assembly so that their longitudinal axes are parallel to one another and to the plane of substrate movement, but the sputtering surface of each target segment is inclined toward the other target segment, to concentrate the material which is sputter-removed from the target surfaces and deposited onto the substrate. Preferably, the cathode assembly also includes third and fourth target segments, shorter than the first and second segments. All four target segments may be separate pieces having mitered ends to engage one another in the form of a rectangular frame, or they may be parts of a unitary target structure. A mounting arrangement holds the target segments in electrical and thermal contact with a support in the cathode assembly and in the desired rectangular frame arrangement.

In an actual embodiment of the invention in which the sputtering surfaces of first and second target segments were inclined at an angle of 45° to the plane of the target frame (i.e., the target segments were inclined toward each other at an included angle of 90°) the length of the sputtered material deposition pattern in the scan direction, at the appropriate target-to-substrate spacing, was reduced to approximately three inches from the approximately six inches obtained from a four-segment target frame of the same dimensions in which the sputtering surfaces were not inclined with respect to the plane of the frame (i.e., a planar target). Both target arrangements were tested in a sputtering system designed to coat a twelve inch long substrate, or an array of substrates which lie on a twelve inch long tray, known as a pallet. By substituting the tilted-face target for the planar target, overscan losses were reduced from 33% to 20%.

Inward inclination of the sputtering surfaces of the third and fourth target segments has the advantage of concentrating the sputtered material in the dimension transverse to the scan direction, thereby minimizing the aforementioned target end losses. In the same embodiment described above, the cathode produced a deposition zone width of twelve and one quarter inches as compared with sixteen inches for a planar cathode of equivalent dimensions. Since the substrate width coated by means of this cathode was twelve inches, end losses were therefore substantially reduced.

A further aspect of the invention is dictated by the close approach of the tilted target segments to the substrate scanning plane. In the above-identified embodiment, the the shortest distance from target segment to substrate plane is approximately one-half inch. Although the gas discharge is normally confined close to the target surface by the magnetic field, the close substrate to target spacing can cause an appreciable bombardment of the substrate by discharge particles, particularly high energy electrons, resulting in an unacceptable degree of substrate heating.

The problem is avoided by placing an electron capture shield between the target plane and the substrate plane. This shield is maintained at anode potential and is positioned to intercept some of the magnetic flux lines from the cathode. Since electrons tend to escape from the discharge by moving along magnetic field lines, this shield placement has the effect of removing electrons prior to their bombarding the substrate. A cool deposition is thereby maintained.

A mathematical model has been developed to simulate deposition patterns for a variety of focused geometries. Surprisingly, the resulting data have been in good agreement with prediction near the ends in the longitudinal target dimension but not in agreement across the narrow dimension of the target. It is believed that additional material which is deposited at the periphery of the deposition pattern may result from a reflection-like mechanism during the sputtering operation. That is, material impinging on a target face from a facing target face, possibly at a shallow grazing angle, is reflected or remains loosely bound until a subsequent sputtering event dislodges it.

As a result of the nearly closed geometry which is formed by the combination of the cathode, electron capture shielding, and close-in pallet spacing in this preferred embodiment, a high degree of sputtering material conservation is achieved. Virtually all material which is not subject to overscan losses ends up at the pallet, on the dark space shield, or deposited on a facing cathode member. From one test it was determined that 90% of the sputtering material was deposited on the substrate plane, 9% was deposited on the electron capture shielding, and 1% ended up on non-active members of the cathode or dispersed throughout the sputtering chamber. The amount of scattered material was reduced by greater than an order of magnitude from that in existing sputtering systems, resulting in reduced maintenance requirements and cleaner machine operation.

BRIEF DESCRIPTION OF THE DRAWINGS

The invention is further explained in the following detailed description in conjunction with the annexed drawings in which.

DETAILED DESCRIPTION

Early investigations of the sputtering process have shown that in most cases the spatial distribution of the sputtered atoms ejected from a sputtering target obey Knudsen's Cosine law. This law states that the flux of atoms dm, emanating from a point source on a sputtering surface and passing through a solid angle dw is determined by the relation:

$$dm = k \cos\phi \, dw$$

where
  $k$ = a constant
  $\phi$ = the angle between the normal to the surface and the direction in which the flux is measured.

The flat sputter targets used in diode sputtering can, therefore, be considered as a planar array of point sources, each of which emits sputtered atoms according to the above law. A planar magnetron target, on the other hand, does not behave as a planar array of point sources, since sputtering is confined to the racetrack region of the target. Instead, the planar magnetron target behaves more as a linear array of point sources, the linear array being determined by the shape of the racetrack.

From this combination of the cosine distribution law and the linear nature of the magnetron source, it can be shown that if the sputtering surfaces underlying two long sides of a racetrack region are tilted toward each other, the sputtered atoms emitted from various points along the line source can be made to converge to a narrow deposition zone with correspondingly increased deposition rate.

Figure 1:
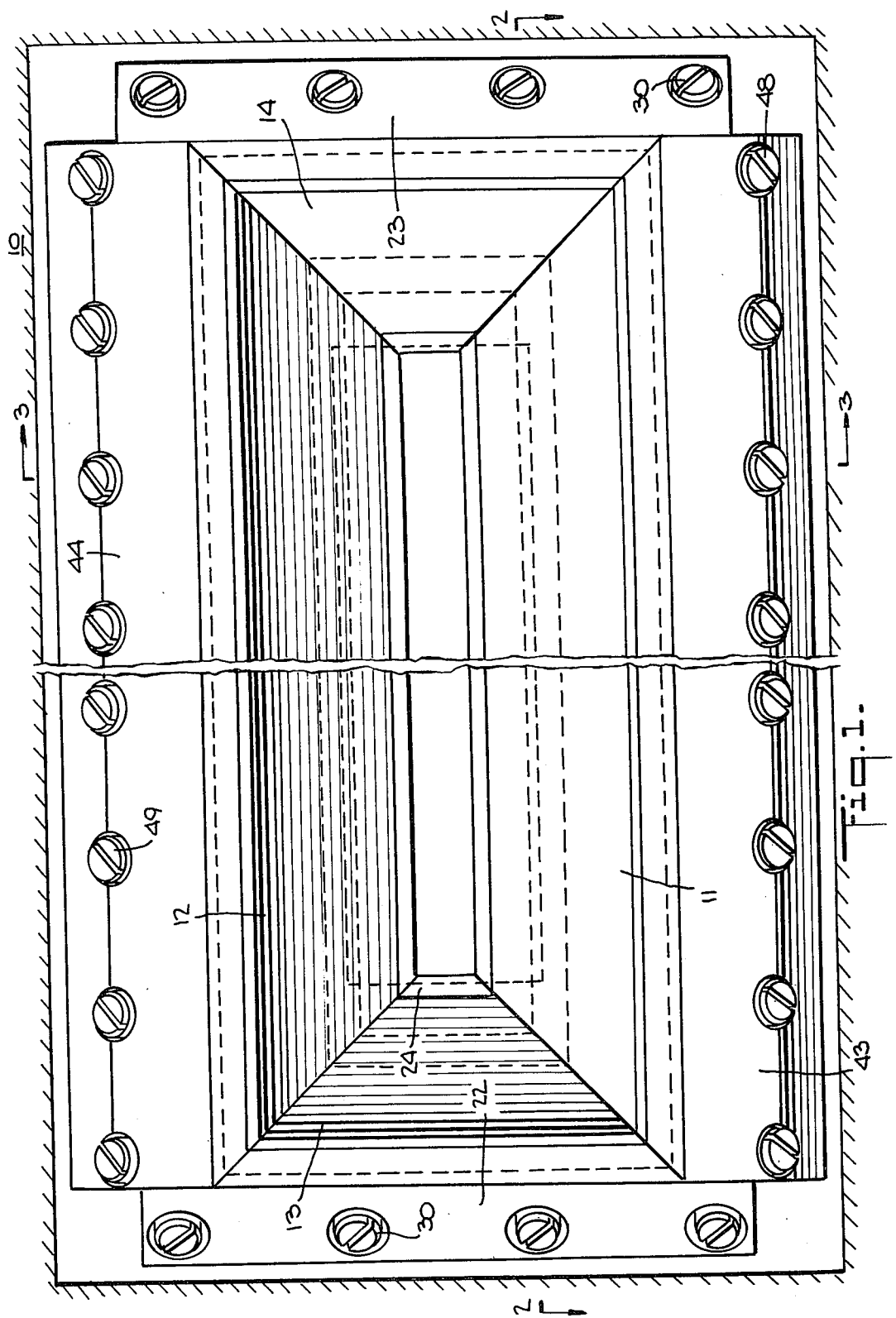
FIG. 1 is a plan view of a cathode assembly for a magnetron sputtering apparatus in accordance with the principles of the invention.

FIG. 1 shows a plan view of a cathode assembly which is generally designated by reference number 10, having a pair of longitudinal target segments in the form of bars 11 and 12, and a pair of end target segments in the form of 13 and 14. Target bars 11, 12, 13 and 14, are formed, at least partially, of a material which is to be sputter-removed from the target bars and deposited onto a substrate 15 transported past the cathode assembly on a wheeled-pallet 15a (see FIG. 3). The target bars have mitered ends so as to form a rectangular, frame-like arrangement. Although the segments are easier in most cases to manufacture as separate bars, the target can also be made as a one-piece frame-like structure, if desired.

Figure 2:
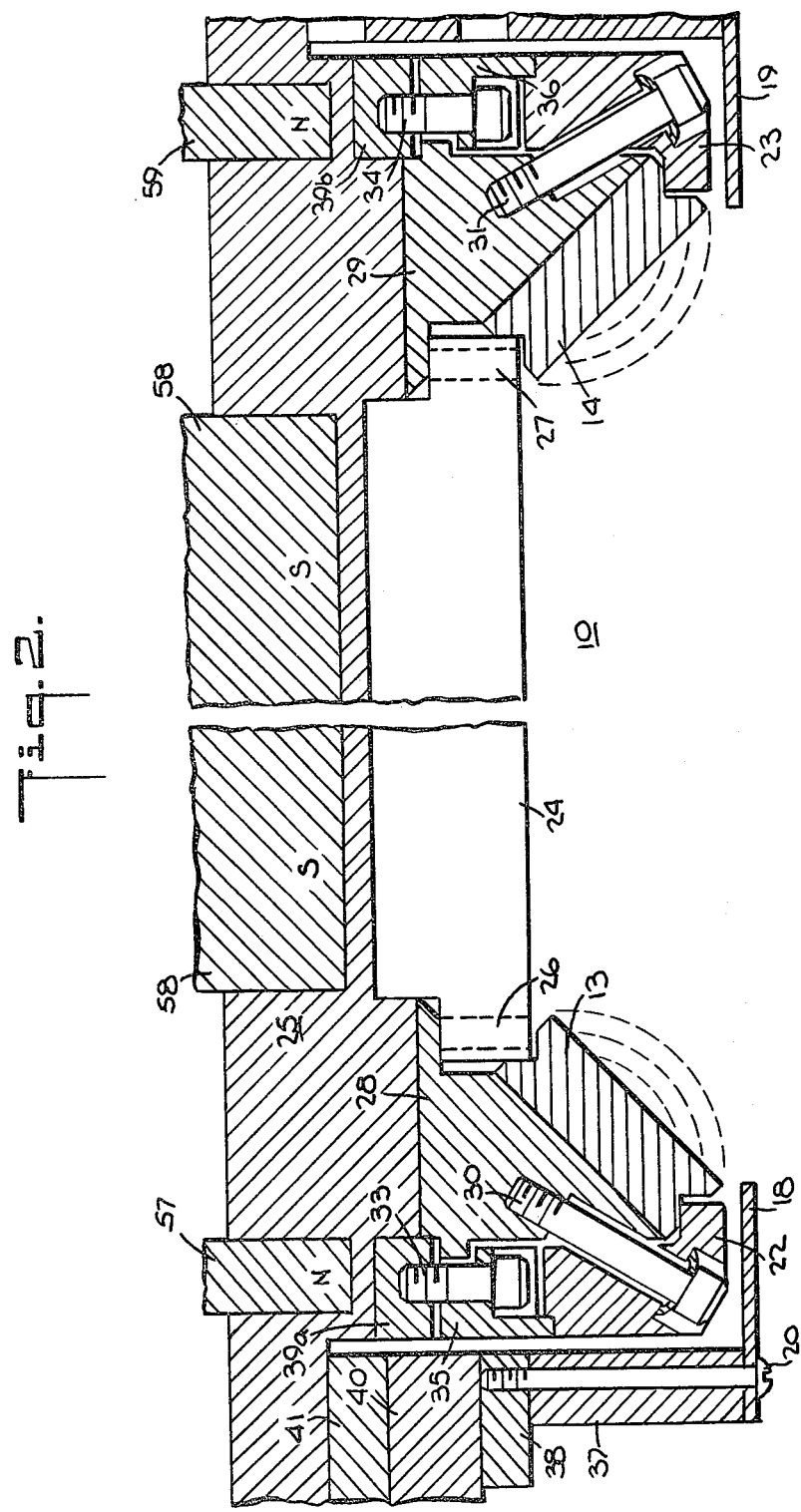
FIG. 2 is a cross-sectional representation of the embodiment of FIG. 1 taken along line 2—2.
Figure 3:
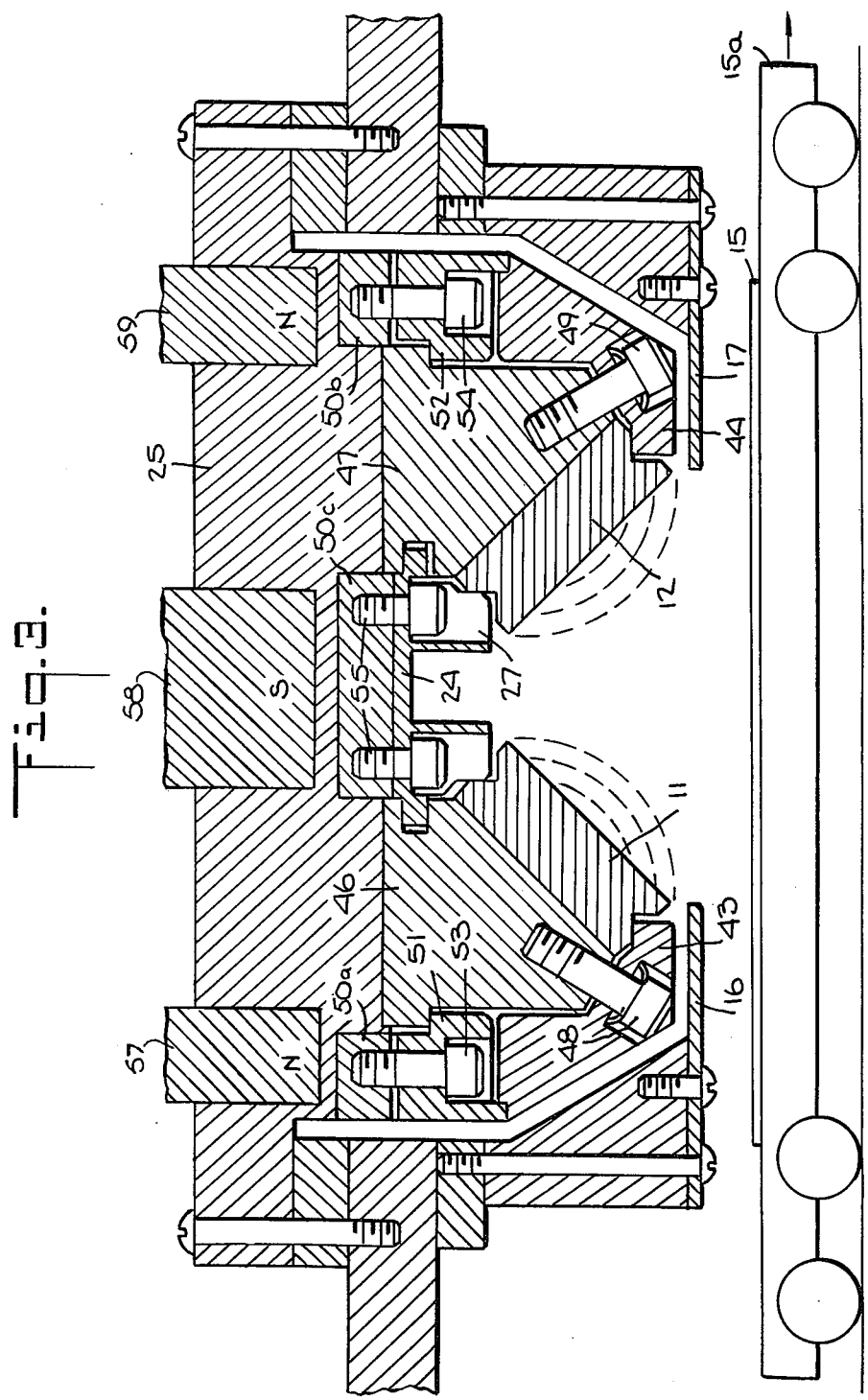
FIG. 3 is a cross-sectional representation of the embodiment of FIG. 1 taken along line 3—3.

It is desirable to prevent contamination by a film deposited on the substrate by material which is sputter-removed from non-target parts of the cathode, such as structural elements which hold the target bars to the cathode assembly. In this embodiment, such contamination is prevented by electron capture shields 16, 17, 18 and 19, which, as shown in FIGS. 2 and 3, are disposed near target bars 11, 12, 13 and 14, respectively. The electron capture shields are formed of non-magnetic metallic material and are maintained at or near anode (i.e., ground) potential. Thus, a large voltage differential exists between the target bars and the electron capture shields. The electron capture shields are attached to the grounded chamber wall by a plurality of screws 20, as shown in FIGS. 2 and 3.

FIG. 2 is a cross-sectional view of the cathode assembly taken along line 2—2 of FIG. 1. FIG. 2 shows end target bars 13 and 14 held in position by magnetically soft clamp pieces 22 and 23, respectively. A magnetically soft central pole piece 24, which is arranged adjacent to cover plate 25, cooperates in holding end target bars 13 and 14 in position. Central pole piece 24 is provided with bores 26 and 27 (shown in phantom) at respective flange portions for passing connection bolts (not shown in this figure) which engage water-cooled cover plate 25. End target bar 13 rests in contact with a non-magnetic support base 28 which is held to water-cooled cover plate 25 by a bolt 33 and magnetically soft clamp 35. Bolt 33 engages a magnetically soft pole piece 39a brazed into water-cooled cover plate 25. A non-magnetic bolt 30 maintains the magnetically soft clamp 22 in contact with end target bar 13, thereby urging it into intimate contact with support base 28. Pole piece 39a plus clamps 35 and 22 cooperate to provide a path of low magnetic reluctance from north magnet pole 57 to the surface of target bar 13. Magnetic field lines, indicated by dashed lines, therefore extend from clamp 22 to pole piece 24, which is positioned adjacent to south magnet pole 58. In a similar fashion, a non-magnetic support base 29, upon which end bar 14 rests, is held against water-cooled cover plate 25 by a bolt 34 and magnetically soft clamp 36. Bolt 34 engages a magnetically soft pole piece 39b brazed into water-cooled cover plate 25. A non-magnetic bolt 31, maintains the magnetically soft clamp 23 in contact with target bar 14, thereby urging it into intimate mechanical and thermal contact with support base 29. Pole piece 39b plus clamps 36 and 23 cooperate to provide a path of low magnetic reluctance from north magnet pole 59 to the surface of end target bar 14. Magnetic field lines, indicated by dashed lines, therefore extend from clamp 23 to pole piece 24, which is positioned adjacent to south magnet pole 58.

Electron capture shields 18 and 19 are each affixed by means of screws 20 extending through a stand-off 37 to a spacer 38 which is brazed or otherwise fastened to a top wall 40 of an evacuable chamber (not specifically designated) in which the deposition operation takes place. Top wall 40 is provided with an insulated layer 41 containing O-ring seals (not shown) for preventing leaks. The opening in top wall 40 of the evacuable chamber, through which cathode assembly 10 accesses the evacuable chamber, is closed by cover plate 25 which rests upon and seals to insulating layer 41. Insulator 41 prevents electrical contact between top wall 40, which in this embodiment is at anode potential, and cover plate 25, which is at cathode potential.

FIG. 3 is a transverse cross-sectional representation of cathode assembly 10 taken along line 3—3 of FIG. 1. The figure shows longitudinal target bars 11 and 12 held in place between central pole piece 24 and soft magnetic clamp pieces 43 and 44, respectively. Longitudinal target bar 11 is in contact with non-magnetic support base 46. Non-magnetic bolt 48 causes clamp 43 to urge target bar 11 into intimate mechanical and thermal contact with support base 46. Similarly, non-magnetic bolt 49 causes clamp 44 to urge target bar 12 into intimate thermal and mechanical contact with support base 47.

A pair of longitudinal, soft magnetic clamps 51 and 52 are mechanically connected by bolts 53 and 54 to pole pieces 50a and 50b, which are brazed into water-cooled cover plate 25. Similarly, pole piece 24 is connected by bolts 55 to pole piece 50c, which is brazed into water cooled backing plate 25. The combined action of the clamps, bolts, and brazed pole pieces is to hold support bases 46 and 47 in intimate thermal contact with water cooled cover plate 25.

Soft magnetic pole piece 50b cooperates with soft magnetic clamps 52 and 44 to provide a path of low magnetic reluctance between north magnet pole 59 and the surface of longitudinal target bar 12.

Similarly, pole pieces 50c and 24 provide a path of low magnetic reluctance between south magnet pole 58 and the surface of longitudinal target bar 12. As a consequence, magnetic field lines, indicated by dashed lines, extend from clamp 44 to pole piece 24, and therefore form an arch across the surface of longitudinal target bar 12.

In like manner, the soft magnetic pole piece 50a cooperates with soft magnetic clamps 51 and 43 to provide a path of low magnetic reluctance between north magnet pole 57 and the surface of longitudinal target bar 11. Magnetic field lines, indicated by dashed lines, extend from clamp 43 to pole piece 24, and therefore form an arch across the surface of longitudinal target bar 11.

The arch shaped magnetic field lines over longitudinal target bars 11 and 12, cooperate with similar magnetic field lines over end target bars 13 and 14, to provide the arched, closed loop magnetic field required for efficient magnetron sputtering of the target bars.

The magnet poles 57, 58 and 59, may be formed by either electromagnets or permanent magnets. Either configuration is equally effective in achieving the desired magnetic field configuration adjacent to the target bars.

Figure 4:
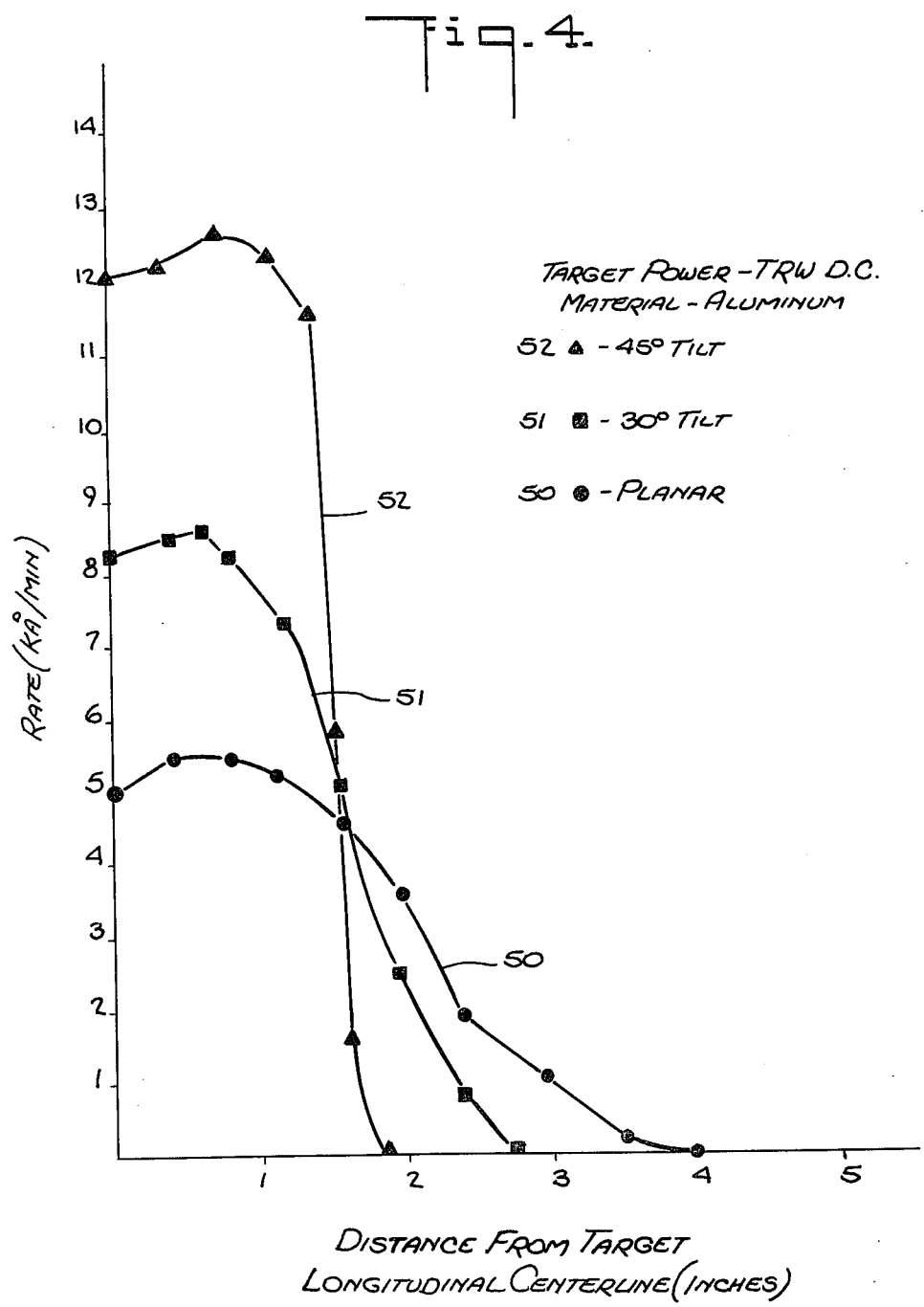
FIG. 4 is a graph which compares the rates and cross-sectional profiles of film deposition for several sputtering surface configurations.

Two specific embodiments of the invention have been constructed and operated, in which the target bars are tilted inwardly 30° and 45°, respectively, to a plane parallel to the substrate plane (i.e., the target bars were inclined toward each other at included angles of 90° and 120°, respectively). The width of the sputtering face of each long bar was about 1½ inch, and the spacing between the upper edges was about ¾ inch. The length of the long bars was about 12 inches, but their length may be typically from about 6 inches to about 30 inches, depending on the sputtering chamber and substrate dimensions. FIG. 4 is a compound graph which illustrates the relationship between the rate of film deposition in units of kiloangstroms/min (kA/Min) measured vs. the distance from the longitudinal centerline of the target assembly. The cathode was operated at 7kw DC power, and the rate measurements were made at the substrate plane.

Plot 50 in FIG. 4 shows a film growth rate profile for a conventional planar target arrangement in which the material removal surface is parallel to the substrate plane. The specific target arrangement consisted here of four target bars in a rectangular frame, but single-plate planar targets will yield substantially identical results. A nominal two-inch target-to-substrate distance was used to generate plot 50.

Plot 51 of FIG. 4 shows a film growth rate profile in which all four target bars were inclined inwardly by 30°. The length and width of the race-track remained approximately the same as in the previous case. However, because of the tilting, the target to substrate distance can not be defined by a single dimension. Plot 51 of FIG. 4 was obtained at a closest spacing between substrate plane and tilted bar of 1⅛ inches. It should be noted that the width of the deposition zone was reduced from approximately eight inches for the planar case to five and one half inches. The peak film deposition rate was also increased from 5.5 kA/Min to 8.6 kA/Min.

Plot 52 of FIG. 4 shows a film growth rate profile for an arrangement in which all four target bars were inclined inwardly by 45°. In this case, closest spacing between tilted bar and substrate plane was approximately one-half inch. It should be noted that the deposition zone width is further reduced to a width of three and one-half inches. The peak film deposition rate has been increased to 12.5 kA/Min. It can be seen from this comparison that substantial narrowing of the deposition zone and increase in the peak film deposition rate is achieved with the inventive tilted bar concept.

Although the inventive concept has been disclosed in terms of specific embodiments and applications, it is to be understood that, in light of this teaching, persons skilled in the art can make additional embodiments without departing from the scope of the claimed invention. Accordingly, it is to be understood that the drawings and description serve to illustrate the principles of the invention, and should not be construed to limit the scope thereof. In particular, although the preferred embodiment of the tilted target arrangement of the invention is in the form of four separate bars with ends mitered to fit together as a rectangular frame, the target can be made also as a one-piece rectangular unit, for example by stamping, forging, or casting.

What is claimed is:

1. A magnetron sputtering apparatus including a cathode assembly mounted in an evacuable chamber opposite a substrate plane, the cathode assembly comprising an elongated annular sputtering target which has a sputtering surface composed of a material to be deposited on a substrate disposed at the substrate plane and a contact surface opposite the sputtering surface, a target support, means for clamping the sputtering target with said contact surface in thermal and electrical contact with the target support, and a magnet arrangement positioned near the sputtering target for providing a closed-loop tunnel-shaped magnetic field enclosing the sputtering surface of the sputtering target, wherein the sputtering target comprises first and second elongated substantially straight parallel side portions and first and second end portions, shorter than the side portions, each of said side and end portions having an inner peripheral edge and an outer peripheral edge and said portions being arranged as an oblong frame, the sputtering surfaces of the side portions and the end portions being generally flat and respectively inclined toward each other at an angle between 90° and 120°, and the contact surfaces of the side and end portions being approximately flat and parallel to the respective sputtering surfaces of said portions; and the means for clamping the sputtering target in contact with the target support comprises means forming an annular pole piece of magnetically permeable metal, said annular pole piece contacting the outer peripheral edges of said side and end portions, and means forming an elongated inner pole piece of magnetically permeable metal, said inner pole piece contacting the inner peripheral edges of said side and end portions, said annular pole piece and said inner pole piece forming part of said magnet arrangement.

2. A magnetron sputtering apparatus according to claim wherein the sputtering surfaces of the side portions of the target are at an angle of 120° with respect to each other.

3. A magnetron sputtering apparatus according to claim 1 wherein the sputtering surfaces of the side portions of the target are at an angle of 90° with respect to each other.

4. A magnetron sputtering apparatus according to claim 1 wherein the sputtering surfaces of the end portions of the target are at an angle of 120° with respect to each other.

5. A magnetron sputtering apparatus according to claim 1 wherein the sputtering surfaces of the end portions of the target are at an angle of 90° with respect to each other.

6. A magnetron sputtering apparatus according to claim 1 wherein the substrate plane is disposed close to the sputtering target so as to maximize the amount of target material deposited on substrates located at the substrate plane, and the apparatus further comprises an annular electron capture shield positioned adjacent to the outer peripheral edges of the side and end portions of the sputtering target and electrically insulated from the cathode assembly for intercepting electrons that may escape from the tunnel-shaped magnetic field during sputtering of the target, to prevent overheating of the substrate.

7. A magnetron sputtering apparatus according to claim 6 wherein the distance between the substrate plane and a plane defined by the outer peripheral edges of the side and end portions of the sputtering target is no more than one and one-third inches.

8. A magnetron sputtering apparatus according to claim 6 wherein the distance between the substrate plane and a plane defined by the outer peripheral edges of the side and end portions of the sputtering target is between one-half inch and one and one-third inch.

* * * * *